US 9,504,182 B2

(12) United States Patent
Olsson et al.

(10) Patent No.: US 9,504,182 B2
(45) Date of Patent: Nov. 22, 2016

(54) ELECTRICAL HOUSING HAVING COOLING AND SOUND-ABSORBING MEANS

(71) Applicant: ABB TECHNOLOGY LTD, Zürich (CH)

(72) Inventors: Carl-Olof Olsson, Västerås (SE); Petter Johansson, Göteborg (SE)

(73) Assignee: ABB TECHNOLOGY LTD, Zürich (CH)

( * ) Notice: Subject to any disclaimer, the term of this patent is extended or adjusted under 35 U.S.C. 154(b) by 0 days.

(21) Appl. No.: 14/889,068

(22) PCT Filed: Jun. 14, 2013

(86) PCT No.: PCT/EP2013/062385
§ 371 (c)(1),
(2) Date: Nov. 4, 2015

(87) PCT Pub. No.: WO2014/198333
PCT Pub. Date: Dec. 18, 2014

(65) Prior Publication Data
US 2016/0088763 A1    Mar. 24, 2016

(51) Int. Cl.
*H05K 7/20* (2006.01)
*H02B 1/56* (2006.01)
(Continued)

(52) U.S. Cl.
CPC ............ *H05K 7/20127* (2013.01); *H02B 1/56* (2013.01); *H05K 7/2089* (2013.01)

(58) Field of Classification Search
CPC ............... H05K 7/20; H05K 7/20127; H05K 7/20136; H05K 7/20736; H05K 7/2089; G06F 1/20; G06F 1/181; F01N 1/10; F01N 1/24; F01N 1/16; F01N 13/00; H02K 5/24; E04F 17/04; G10K 11/00; G10K 11/04
USPC ........ 361/679.46–679.5, 690–695, 717–728, 361/831; 165/80.3, 104.33, 121–126; 181/200–208, 198, 224–229, 252–258, 181/268, 286, 288, 290–295; 454/184; 312/223.2
See application file for complete search history.

(56) References Cited

U.S. PATENT DOCUMENTS 3,451,503 A * 6/1969 Twomey ................. H01F 27/33
                                                              181/202
6,198,627 B1 * 3/2001 Roehling ................ G06F 1/181
                                                              361/679.33
(Continued)

FOREIGN PATENT DOCUMENTS

CN    101997276 A    3/2011
CN    201821014 U    5/2011
(Continued)

*Primary Examiner* — Michail V Datskovskiy
(74) *Attorney, Agent, or Firm* — Birch, Stewart, Kolasch & Birch, LLP

(57) ABSTRACT

An apparatus for enclosing a medium and/or high voltage unit connectable to an electric power system. The unit includes one or a plurality of electrical components and generates heat as a by-product during operation. The apparatus includes a housing including a main chamber housing a seat for holding the unit. The main chamber is arranged to house the unit. The housing includes at least one gas exit opening at an upper part of the housing and at least one gas entry opening. The housing includes a sound-absorptive gas exit chamber provided with the at least one gas exit opening. The housing includes a sound-absorptive gas entry chamber provided with the at least one gas entry opening. A first heat convection path is provided inside the housing between the at least one gas entry opening and the at least one gas exit opening, via the gas entry chamber, via the main chamber and via the gas exit chamber, in order to provide cooling. Each of the gas exit chamber and the gas entry chamber houses at least one sound-absorbing member for absorbing sound produced by the unit during operation. At least one of the gas exit chamber and the gas entry chamber has at least one heat conducting wall and at least one free space provided between the at least one sound-absorbing member and said wall such that the first heat convection path is provided inside the housing between the at least one gas entry opening and the at least one gas exit opening via the at least one free space.

20 Claims, 5 Drawing Sheets

(51) Int. Cl.
*G06F 1/20* (2006.01)
*F01N 1/10* (2006.01)

(56) References Cited

U.S. PATENT DOCUMENTS

| | | | | |
|---|---|---|---|---|
| 6,745,149 | B2 * | 6/2004 | Beeten | H05K 7/20136 |
| | | | | 312/223.1 |
| 7,400,501 | B2 * | 7/2008 | Bartell | H05K 7/20736 |
| | | | | 361/695 |
| 7,724,515 | B2 | 5/2010 | Fukuda et al. | |
| 7,782,612 | B2 * | 8/2010 | Walsh | H05K 5/0213 |
| | | | | 165/104.33 |
| 7,783,055 | B2 * | 8/2010 | Barath | G10K 11/1788 |
| | | | | 381/71.3 |
| 7,986,526 | B1 * | 7/2011 | Howard | H05K 7/1488 |
| | | | | 181/200 |
| 8,028,793 | B2 * | 10/2011 | Bard | A47B 97/00 |
| | | | | 181/198 |
| 8,593,003 | B2 * | 11/2013 | Niwa | F02B 63/04 |
| | | | | 290/2 |
| 2007/0110255 | A1 | 5/2007 | Barath et al. | |
| 2008/0007911 | A1 * | 1/2008 | Hallin | G06F 1/181 |
| | | | | 361/679.47 |
| 2011/0123036 | A1 * | 5/2011 | Barath | G10K 11/1788 |
| | | | | 381/71.3 |
| 2011/0175504 | A1 | 7/2011 | Cook | |

FOREIGN PATENT DOCUMENTS

| | | |
|---|---|---|
| CN | 201821015 U | 5/2011 |
| CN | 201829830 U | 5/2011 |
| CN | 202352330 U | 7/2012 |
| CN | 202474598 U | 10/2012 |
| EP | 1 531 308 A1 | 5/2005 |
| JP | 2006-105514 A | 4/2006 |
| WO | WO 2005/001215 A | 1/2005 |
| WO | WO 2011/121450 A2 | 10/2011 |
| WO | WO 2012/141949 A2 | 10/2012 |

* cited by examiner

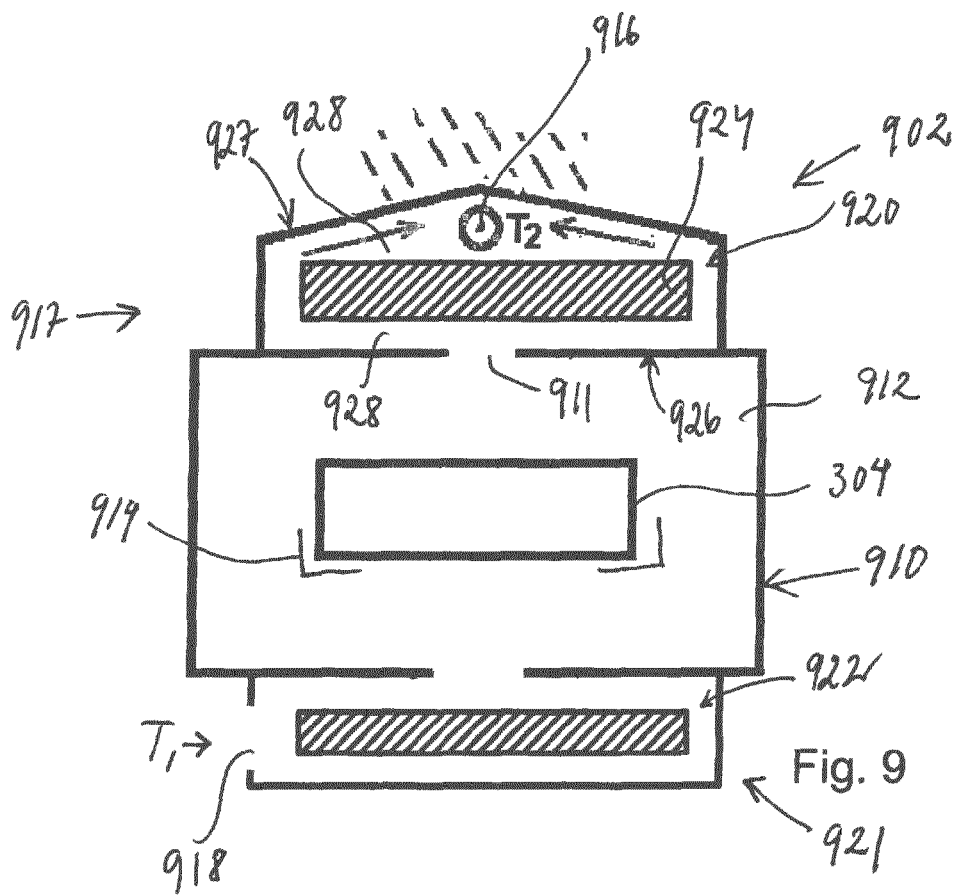
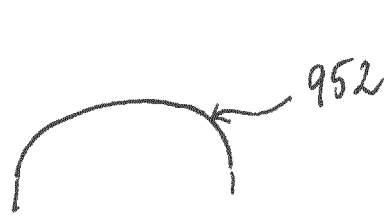
Fig. 10a
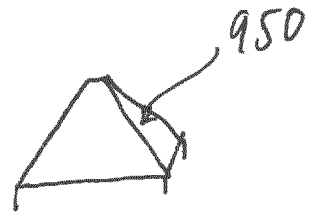
Fig. 10b
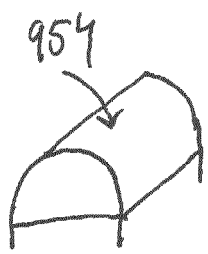
Fig. 10c

ELECTRICAL HOUSING HAVING COOLING AND SOUND-ABSORBING MEANS

TECHNICAL FIELD

The present invention relates to an apparatus for enclosing at least one medium and/or high voltage unit connectable to an electric power system. Each unit comprises one or a plurality of electrical components and generates heat as a by-product during operation. The apparatus comprises a housing which comprises a main chamber housing a seat for holding the unit, the main chamber being arranged to house the unit. The housing comprises at least one gas exit opening at an upper part of the housing and at least one gas entry opening. The housing comprises a sound-absorptive gas exit chamber provided with the at least one gas exit opening, and the housing comprises a sound-absorptive gas entry chamber provided with the at least one gas entry opening. Further, the present invention relates to an electric power arrangement comprising at least one medium and/or high voltage unit connectable to an electric power system, each unit comprising one or a plurality of electrical components, wherein the electric power arrangement comprises at least one apparatus of the above-mentioned sort.

BACKGROUND OF THE INVENTION

Electric power systems, e.g. high voltage systems, such as systems for electric power transmission or distribution, often comprise capacitor units comprising one or a plurality of capacitors, e.g. medium or high voltage capacitors. These capacitor units produce sound or noise during operation, and the sound may be disturbing and have a negative effect on the surroundings. It has been suggested to enclose the capacitor unit by means of a housing or enclosure in order to attenuate (reduce) the sound from the capacitor unit. However, the capacitor unit also generates heat as a by-product during operation, which should be considered when enclosing the capacitor unit. Thus, the housing or enclosure also has to provide sufficient cooling of the capacitor unit to meet the individual unit cooling requirements at site. In order to avoid that the sound-absorptive housing interior become too hot, the housing may be provided with an inlet air opening (entrance for air) and an outlet air opening (exit for air), and a heat convection path is provided inside the housing between the inlet air opening and the outlet air opening in order to provide cooling. In order to make the housing sufficiently sound-absorptive, the inlet and outlet openings is often provided with so called sound traps, which absorb, or trap, the sound but allow the air to pass therethrough. Prior-art sound-absorptive housings with cooling are illustrated in the appended FIGS. 1-2.

Medium and/or high voltage units comprising one or a plurality of reactors or transformers may also produce sound or noise, which may have a negative effect on the surroundings.

CN 201821014U discloses a structure of a high voltage capacitor chamber comprising two layers of machine rooms and an air inlet and an air outlet for ventilation of the machine rooms. The structure is said to eliminate noise pollution.

CN 202474598U describes a sound-insulation cooling device for a transformer chamber and a reactor chamber.

SUMMARY OF THE INVENTION

The inventors of the present invention have found that the cooling of an enclosure, which houses a medium and/or high voltage unit connectable to an electric power system and comprising one or a plurality of electrical components, e.g. capacitors, and generating heat and sound during operation, where the cooling is provided by providing a heat convection path inside the enclosure between an air opening and an outlet air opening and where sound traps are provided at the inlet air opening and at the outlet air opening, is not sufficient or efficient enough for all applications, especially for high voltage applications and especially where the ambient temperature is high.

The object of the present invention is thus to provide an improved enclosure for a medium and/or high voltage unit comprising one or a plurality of electrical components, where the enclosure provides sound absorption and cooling of the unit.

Another object of the present invention is to improve the cooling of the interior of a sound-absorptive enclosure which houses a medium and/or high voltage unit, while maintaining or providing sufficient sound absorption or sound attenuation.

The above-mentioned objects of the present invention are attained by providing an apparatus for enclosing at least one medium voltage and/or high voltage unit connectable to an electric power system. Each unit comprises one or a plurality of electrical components and generates heat as a by-product during operation. The apparatus comprises a housing which comprises a main chamber housing a seat for holding the unit, the main chamber being arranged to house the unit. The housing comprises at least one gas exit opening at an upper part of the housing and at least one gas entry opening. The housing comprises a sound-absorptive gas exit chamber provided with the at least one gas exit opening, and the housing comprises a sound-absorptive gas entry chamber provided with the at least one gas entry opening. A first heat convection path is provided inside the housing between the at least one gas entry opening and the at least one gas exit opening, via the gas entry chamber, via the main chamber and via the gas exit chamber, in order to provide cooling. Each of the gas exit chamber and the gas entry chamber houses at least one sound-absorbing member made at least partially of a sound-absorbing material for absorbing sound produced by the unit during operation. At least one of the gas exit chamber and the gas entry chamber has at least one heat conducting wall and at least one free space provided between the at least one sound-absorbing member and said wall such that the first heat convection path is provided inside the housing between the at least one gas entry opening and the at least one gas exit opening via the at least one free space.

By providing said at least one free space between the at least one sound-absorbing member and said wall and including the at least one free space in the first heat convection path, the heat from the wall heats the gas or gas mixture flowing in and passing through the at least one free space, whereby the temperature of the gas or gas mixture, e.g. air, leaving the at least one gas exit opening will be further increased, and thus, the gas or gas mixture flow through the housing and along the first heat convection path is enhanced, for reasons disclosed in further detail in the detailed description of embodiments. The cooling is improved by the enhanced gas or gas mixture flow through the housing. This would not be the case if the sound-absorbing member were adjoining the wall, as the thermal insulating material of the sound-absorbing member would prevent the heat from the wall to heat the gas of the sound-absorptive gas exit chamber. Positive effects of providing said at least one free space between the at least one sound-absorbing member and said wall and including the at least one free space in the first heat convection path are disclosed in more detail hereinafter, especially in connection with the various embodiments of the apparatus according to the present invention disclosed below in the detailed description of embodiments. By means of the apparatus according to the present invention, the cooling of the interior of a sound-absorptive housing is improved while providing sufficient sound absorption or sound attenuation. By means of the apparatus according to the present invention, an improved enclosure for a medium and/or high voltage unit (or units) comprising one or a plurality of electrical components, where the enclosure provides sound absorption and cooling of the unit, is provided.

The wall may have a surface facing the sound-absorbing member (or in alternative words, facing the at least one free space), and said surface should thus be free of any sound-absorbing material. Said surface should be free of any thermal or heat insulating material. The at least one unit may be one or a plurality of units. Each unit may be a high voltage unit. The apparatus according to the present invention is especially advantageous for high voltage electric power systems.

According to an advantageous embodiment of the device according to the present invention, the at least one gas exit opening is located at a height above the unit when the unit is placed in the seat. By means of this embodiment, the cooling is further improved, as the flow of air/gas through the housing via the first heat convection path is enhanced.

According to a further advantageous embodiment of the device according to the present invention, the at least one heat conducting wall comprises a heat conducting first wall situated between the gas exit chamber and the main chamber, the first wall being a wall of the main chamber and of the gas exit chamber, wherein the at least one free space is provided in the gas exit chamber between the at least one sound-absorbing member and the first wall such that the first heat convection path is provided inside the housing between the at least one gas entry opening and the at least one gas exit opening via the at least one free space. By means of this embodiment, the cooling is further improved for reasons disclosed in detail in the detailed description of embodiments.

According to another advantageous embodiment of the device according to the present invention, the first wall is an upper wall at an upper part of the housing. By means of this embodiment, the cooling is further improved, as the flow of air/gas through the housing via the first heat convection path is enhanced.

According to yet another advantageous embodiment of the device according to the present invention, the at least one heat conducting wall comprises a heat conducting second wall situated between the gas entry chamber and the main chamber, the second wall being a wall of the main chamber and of the gas entry chamber, wherein the at least one free space is provided in the gas entry chamber between the at least one sound-absorbing member and the second wall such that the first heat convection path is provided inside the housing between the at least one gas entry opening and the at least one gas exit opening via the at least one free space. By means of this embodiment, the cooling is further improved for reasons disclosed in detail in the detailed description of embodiments.

According to still another advantageous embodiment of the device according to the present invention, the first wall and/or the second wall have/has a first surface facing the unit, and the emissivity of the first surface is between 0.7 and 1, preferably between 0.9 and 1. By means of this embodiment, the heat transfer through the first/second wall from the air/gas of the main chamber to the air/gas of the gas exit/entry chamber is further improved, whereby the flow of air/gas through the housing via the first heat convection path is enhanced, and thus, the cooling is further improved.

According to an advantageous embodiment of the device according to the present invention, the first wall and/or the second wall have/has a second surface facing the sound-absorbing member, and the emissivity of the second surface is between 0.7 and 1, preferably between 0.9 and 1. By means of this embodiment, the heat transfer through the first/second wall from the air/gas of the main chamber to the air/gas of the gas exit/entry chamber is further improved, whereby the flow of air/gas through the housing via the first heat convection path is enhanced, and thus, the cooling is further improved.

According to a further advantageous embodiment of the device according to the present invention, the first wall and/or the second wall have/has a substantially horizontal extension. By means of this embodiment, the air/gas in the main chamber heated by the unit can heat a large portion of the first/second wall in an evenly and distributed manner, whereby said large portion efficiently can heat the air/gas in the at least one free space, enhancing the flow of air/gas through the housing via the first heat convection path. Thus, the cooling is further improved. Alternatively, the first wall and/or the second wall may have an extension in any other direction or directions.

According to another advantageous embodiment of the device according to the present invention, the at least one heat conducting wall comprises a heat conducting third wall situated at an upper part of the housing, the third wall being an exterior wall of the housing and of the gas exit chamber, wherein the at least one free space is provided in the gas exit chamber between the at least one sound-absorbing member and the third wall such that the first heat convection path is provided inside the housing between the at least one gas entry opening and the at least one gas exit opening via the at least one free space. By means of this embodiment, the cooling is further improved for reasons disclosed in detail in the detailed description of embodiments.

According to yet another advantageous embodiment of the device according to the present invention, the at least one heat conducting wall comprises a heat conducting third wall situated at an upper part of the housing, the third wall being an exterior wall of the housing and of the gas exit chamber, wherein at least one second free space is provided between the at least one sound-absorbing member and the third wall, and wherein a second heat convection path is provided inside the housing between the at least one gas entry opening and the at least one gas exit opening, via the gas entry chamber, via the main chamber, via the gas exit chamber and via the at least one second free space, in order to provide cooling. By means of this embodiment, the cooling is further improved for reasons disclosed in detail in the detailed description of embodiments.

According to still another advantageous embodiment of the device according to the present invention, the third wall has a substantially horizontal extension. By means of this embodiment, the sun radiation can efficiently and evenly heat the third wall, whereby the third wall efficiently can heat the air/gas in the at least one free space, enhancing the flow of air/gas through the housing via the first heat convection path. Thus, the cooling is further improved.

According to an advantageous embodiment of the device according to the present invention, the third wall is arched or has a pyramid or dome shape, wherein the at least one gas exit opening is located in an upper region of the arch, pyramid or dome formed by the third wall. By means of this embodiment, the flow of air/gas through the housing via the first heat convection path is further enhanced, whereby the cooling is further improved.

According to a further advantageous embodiment of the device according to the present invention, the at least one gas entry opening is located at a lower part of the housing, e.g. at a height below the at least one gas exit opening. By means of this embodiment, the flow of air/gas through the housing via the first free heat convection path is further enhanced, whereby the cooling is further improved. Alternatively, the at least one gas entry opening may be located at an upper part of the housing, or at any part of the housing, e.g. at a height above the at least one gas exit opening, or at the same height as the at least one gas exit opening.

The above-mentioned objects of the present invention are also attained by providing an electric power arrangement comprising at least one medium and/or high voltage unit connectable to an electric power system, each unit comprising one or a plurality of electrical components, wherein the electric power arrangement comprises at least one apparatus as claimed in any of the claims 1 to 13 and/or at least one apparatus according to any of the other disclosed embodiments of the apparatus. Positive technical effects of the electric power arrangement according to the present invention, and its embodiments, correspond to the technical effects mentioned in connection with the apparatus according to the present invention, and its embodiments.

According to an advantageous embodiment of the electric power arrangement according to the present invention, each electrical component comprises a capacitor. Alternatively, each electrical component comprises a reactor or a transformer. The inventive apparatus is especially advantageous for capacitor units, as these capacitors are known to generate heat as a by-product during operation and produce sound which may be disturbing to the surroundings.

The above-mentioned features and embodiments of the apparatus and the electric power arrangement, respectively, may be combined in various possible ways providing further advantageous embodiments.

Further advantageous embodiments of the apparatus and the electric power arrangement, respectively, according to the present invention and further advantages with the present invention emerge from the dependent claims and the detailed description of embodiments.

BRIEF DESCRIPTION OF THE DRAWINGS

The present invention will now be described, for exemplary purposes, in more detail by way of embodiments and with reference to the enclosed drawings, in which:

FIG. 9 is a schematic sectional side view of a sixth embodiment of the apparatus according to the present invention; and FIGS. 10a-c are schematic views of embodiments of the sound-absorptive gas exit chamber of the apparatus according to the present invention.

DETAILED DESCRIPTION OF EMBODIMENTS

Figure 1:
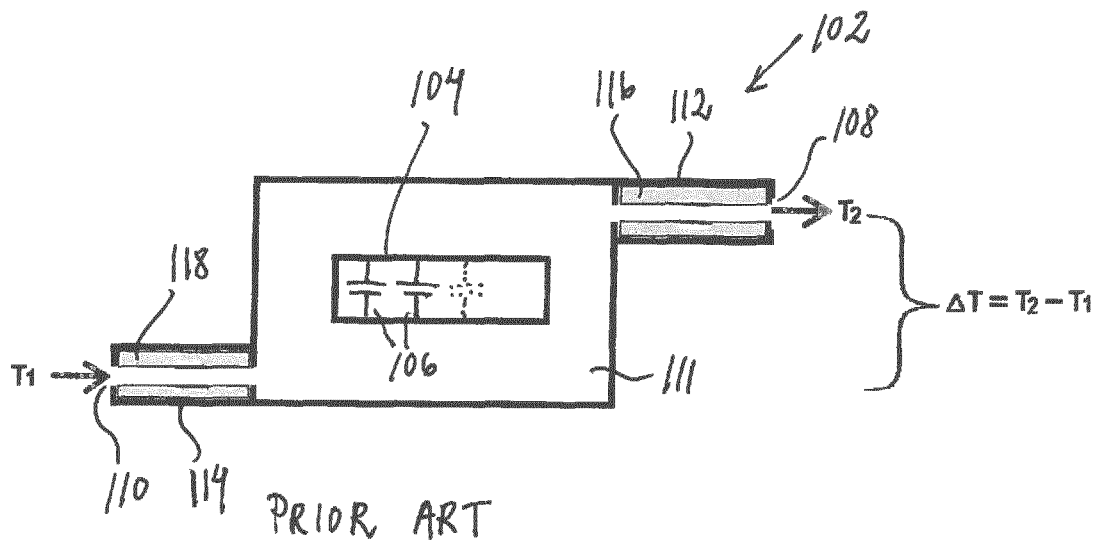
FIG. 1 is a schematic sectional side view of a prior-art enclosure for enclosing a high voltage unit comprising one or a plurality of capacitors.
Figure 2:
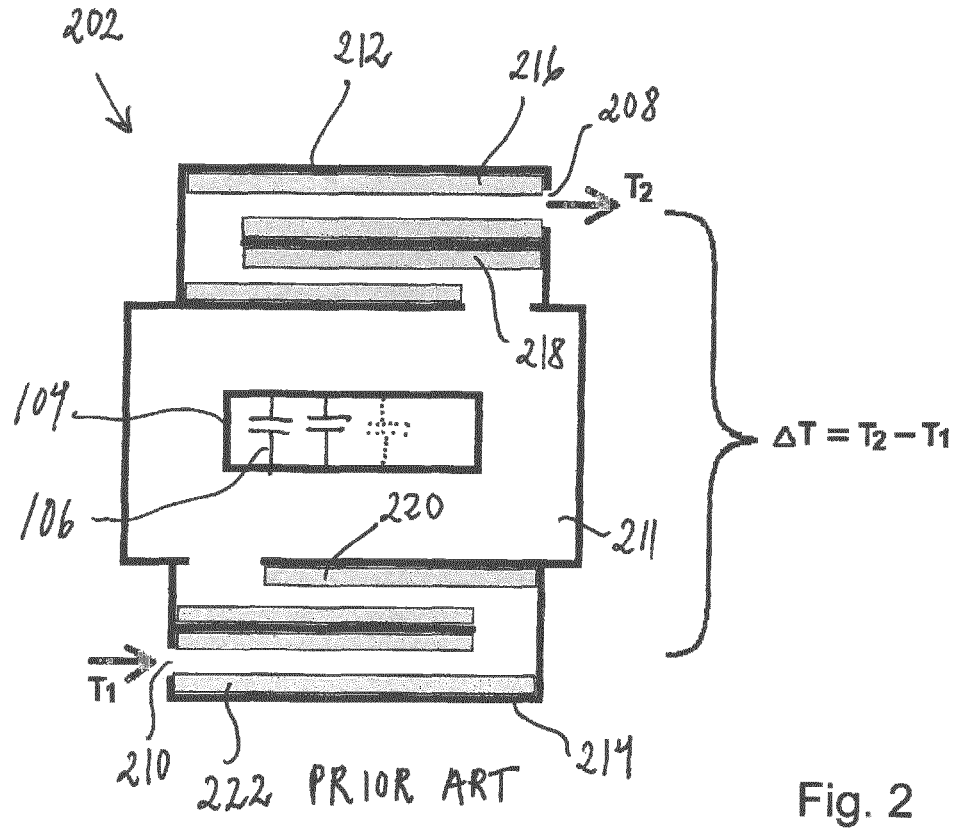
FIG. 2 is a schematic sectional side view of another prior-art enclosure for enclosing a high voltage unit comprising one or a plurality of capacitors.

FIGS. 1-2 schematically show two prior-art enclosures 102; 202 for enclosing a high voltage capacitor unit 104 including one or a plurality of capacitors 106, in order to attenuate sound produced by the capacitor unit 104 under operation. The capacitor unit 104 is connectable to an electric power system. The enclosure 102; 202 also protects the capacitor unit 104 from weather influences and external contaminations. To provide cooling of the capacitor unit 104, which generates heat during operation, each enclosure 102; 202 is provided with a gas exit opening 108; 208 at an upper end of the enclosure 102; 202 and a gas entry opening 110; 210 at a lower end of the enclosure 102; 202. The enclosure 102; 202 includes a main chamber 111; 211 housing the capacitor unit 104. To attenuate the sound produced by the capacitor unit 104, each enclosure 102; 202 includes a sound-absorptive gas exit chamber 112; 212 provided with the gas exit opening 108; 208, and a sound-absorptive gas entry chamber 114; 214 provided with the gas entry opening 110; 210. The cooling is attained by providing a heat convection path inside the enclosure 102; 202 between the gas entry opening 110; 210 and the gas exit opening 108; 208, via the gas entry chamber 114; 214, via the main chamber 111; 211 and via the gas exit chamber 112; 212. Each of the gas exit chamber 112; 212 and the gas entry chamber 114; 214 houses at least one ring-shaped sound-absorbing member 116, 118; 216, 218, 220, 222 made at least partially of a sound-absorbing material for absorbing sound produced by the capacitor unit 104 during operation. The sound-absorbing material may be a fibrous material which has heat insulating properties.

With reference to FIGS. 1 and 2, the driving force creating the air flow along the heat convection path depends partly on the air temperature difference, $\Delta T$, between the gas entry opening 110; 210 and the gas exit opening 108; 208, affecting the density of the flowing air. When the air becomes warmer, the air becomes lighter and thus the air with the temperature $T_2$ will move out of the enclosure 102; 202 through the gas exit opening 108; 208. Air is moved through the enclosure 102; 202 and new cooler air with temperature $T_1$ enters the enclosure 102; 202 through the gas entry opening 110; 210. For the cooling to start, the gas exit opening 108; 208 should be situated geometrically higher than the capacitor unit 104, which may be called a heat source. Instead of air, any other gas or gas mixture could be used for cooling. However, air is often the most convenient gas mixture. The inventors of the present invention have identified that the cooling in prior-art enclosures 102; 202, e.g. of the type disclosed above, is impaired when the ambient air temperature, i.e. the temperature outside of the enclosure 102; 202, already is high at the gas entry opening 110; 210, and as a result, the temperature of the capacitor unit 104 becomes too high.

FIGS. 3-10 schematically show aspects of a plurality of embodiments of the apparatus 302; 402; 502; 602; 702; 902 for enclosing at least one medium voltage and/or high voltage unit 304 according to the present invention. The at least one medium voltage and/or high voltage unit may be one or a plurality of medium voltage and/or high voltage units. Each unit 304 is connectable to an electric power system, e.g. a high voltage system, such as a system for electric power transmission or distribution. Each unit 304 comprises one or a plurality of electrical components 306 and generates heat and sound during operation. Each electrical component 306 may comprise a capacitor 308, i.e. each unit 304 may comprise one or a plurality of capacitors 308, for example medium or high voltage capacitors. Each unit 304 may be called a capacitor unit. In the drawings, each unit and the electrical components are schematically illustrated, and it is to be understood that the unit/units and the electrical component/components may be structured in various different ways and orientated and positioned in various different ways in relation to one another, and in relation to the housing disclosed below.

Alternatively, each unit may comprise one or a plurality of reactors or transformers, e.g. medium or high voltage reactors, or medium or high voltage transformers, or mixtures thereof.

Each apparatus 302; 402; 502; 602; 702; 902 comprises a housing 310; 410; 510; 610; 710; 910. Each housing 310; 410; 510; 610; 710; 910 comprises a main chamber 312; 412; 512; 612; 712; 912 housing a seat 314; 414; 514; 614; 914 for holding the unit 304. Each main chamber 312; 412; 512; 612; 712; 912 is arranged to house the unit 304. Each housing 310; 410; 510; 610; 710; 910 comprises at least one gas exit opening 316; 416; 516; 616; 916 at an upper part 317; 417; 517; 617; 717; 917, e.g. an upper end, of the housing 310; 410; 510; 610; 710; 910 and at least one gas entry opening 318; 418; 518; 618; 918, which may be located at a lower part 321; 421; 521; 621; 921, e.g. a lower end, of the housing 310; 410; 510; 610; 710; 910, e.g. at a height below the at least one gas exit opening 316; 416; 516; 616; 916. The at least one gas exit opening 316; 416; 516; 616; 916 may be located at a height above the unit 304 when the unit 304 is placed in the seat 314; 414; 514; 614; 914. The at least one gas entry opening 318; 418; 518; 618; 918 may be located below the unit 304 when the unit 304 is placed in the seat 314; 414; 514; 614; 914. The at least one gas entry opening may be one or a plurality of gas entry openings. The at least one gas exit opening may be one or a plurality of gas exit openings. Each housing 310; 410; 510; 610; 710; 910 comprises a sound-absorptive gas exit chamber 320; 420; 520; 620; 720; 920 provided with the at least one gas exit opening 316; 416; 516; 616; 916. The gas exit chamber 320; 420; 520; 620; 720; 920 may be located at an upper part 317; 417; 517; 617; 717; 917 or upper end of the housing 310; 410; 510; 610; 710; 910. Each housing 310; 410; 510; 610; 710; 910 comprises a sound-absorptive gas entry chamber 322; 422; 522; 622; 922 provided with the at least one gas entry opening 318; 418; 518; 618; 918. A first heat convection path is provided inside each housing 310; 410; 510; 610; 710; 910 between the at least one gas entry opening 318; 418; 518; 618; 918 and the at least one gas exit opening 316; 416; 516; 616; 916, via the gas entry chamber 322; 422; 522; 622; 922, via the main chamber 312; 412; 512; 612; 712; 912 and via the gas exit chamber 320; 420; 520; 620; 720; 920, in order to provide cooling. Each of the gas exit chamber 320; 420; 520; 620; 720; 920 and the gas entry chamber 322; 422; 522; 622; 922 houses at least one sound-absorbing member 324, 325; 424, 425; 524; 624; 724; 924 made at least partially of a sound-absorbing material for absorbing sound produced by the unit 304 during operation. The sound-absorbing material may be a fibrous material and/or a porous material. The sound-absorbing material may comprise glass wool or fibreglass, or polyester fibres, e.g. fibres of polyethylene terephthalate (PET). The at least one sound-absorbing member 324; 424; 524; 624; 724; 924 may be mounted in various possible ways, e.g. by means of different means of attachment. The at least one sound-absorbing member 324 may be one member or a plurality of members.

At least one of the gas exit chamber 320; 420; 520; 620; 720; 920 and the gas entry chamber 322; 422; 522; 622; 922 has at least one heat conducting wall 326; 426; 526, 527; 626; 726, 727; 926, 927 and at least one free space 328; 428; 528; 628; 728, 729; 928 provided between the at least one sound-absorbing member 324; 424; 524; 624; 724; 924 and said wall 326; 426; 526, 527; 626; 726, 727; 926, 927 such that the first heat convection path is provided inside the housing 310; 410; 510; 610; 710; 910 between the at least one gas entry opening 318; 418; 518; 618; 918 and the at least one gas exit opening 316; 416; 516; 616; 916 via the at least one free space 328; 428; 528; 628; 728, 729; 928. The heat conducting wall 326; 426; 526, 527; 626; 726, 727; 926, 927 may be made of a suitable metal, which conducts heat, or any other material conducting heat.

With reference to FIGS. 3-10, each of the embodiments of the apparatus 302; 402; 502; 602; 702; 902 will hereinafter be described in more detail.

Figure 3:
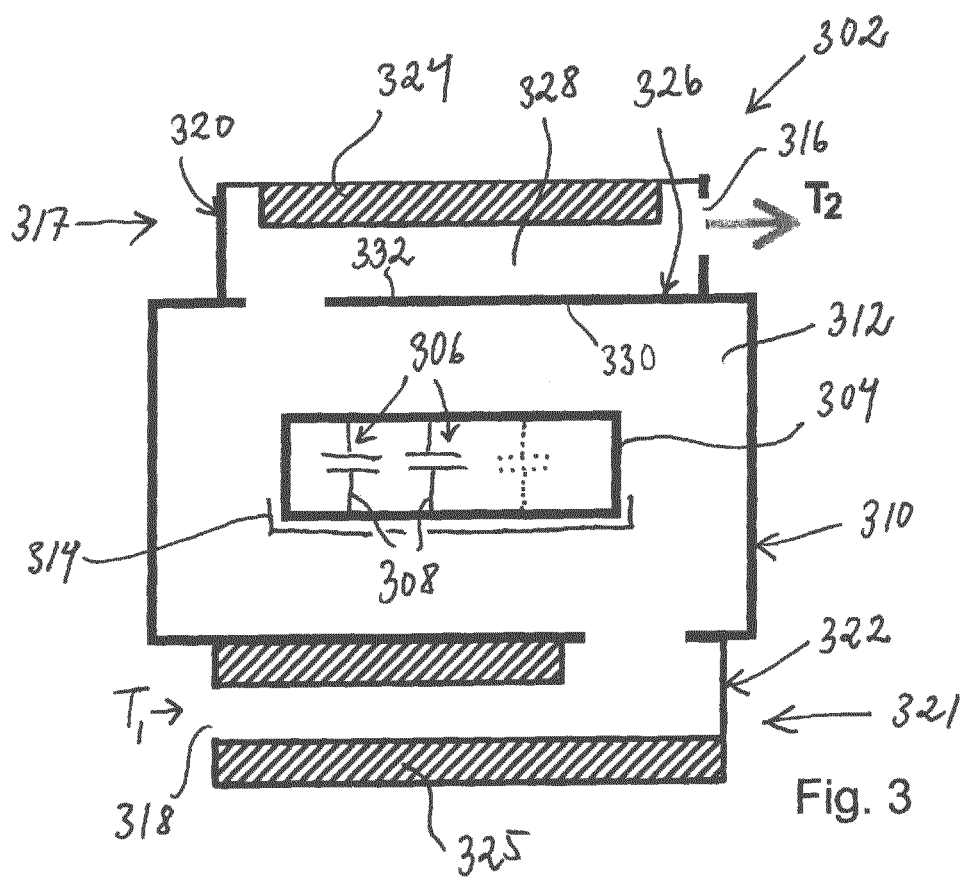
FIG. 3 is a schematic sectional side view of a first embodiment of the apparatus according to the present invention.

With reference to the first embodiment of the apparatus 302 of FIG. 3, the at least one heat conducting wall 326 may comprise a heat conducting first wall 326 situated between the gas exit chamber 320 and the main chamber 312. The first wall 326 is a wall of the main chamber 312 and of the gas exit chamber 320. The first wall 326 may at least partially separate the gas exit chamber 320 from the main chamber 312. The at least one free space 328 is provided in the gas exit chamber 320 between the at least one sound-absorbing member 324 and the first wall 326 such that the first heat convection path is provided inside the housing 310 between the at least one gas entry opening 318 and the at least one gas exit opening 316 via the at least one free space 328. The first wall 326 may be an upper wall at an upper part 317 of the housing 310. The first wall 326 may have a substantially horizontal extension, or an extension in any other direction or directions. By providing said at least one free space 328 between the at least one sound-absorbing member 324 and the first wall 326 and including the at least one free space 328 in the first heat convection path, heat from the unit 304 and received by the first wall 326 heats the gas or gas mixture flowing in and passing through the at least one free space 328, whereby the temperature $T_2$ of the gas or gas mixture, e.g. air, exiting the at least one gas exit opening 316 will be additionally, or further, increased. If the sound-absorbing member instead were adjoining the first wall, as in prior art (see FIG. 2), the thermal insulating sound-absorbing member would hinder the heat transfer through the first wall from the air/gas of the main chamber 312 to the air/gas of the gas exit chamber 320. The additional increase of the temperature $T_2$ of the exit gas mixture exiting the at least one gas exit opening 316, which is provided by the present invention, increases the gas/air temperature difference $\Delta T=T_2-T_1$ between the at least one gas exit opening 316 the at least one gas entry opening 318, i.e. the gas/air temperature difference $\Delta T$ between the temperature $T_2$ of the exit gas exiting the at least one gas exit opening 316 and the temperature $T_1$ of the entry gas entering the at least one gas entry opening 318, whereby the gas or gas mixture flow through the housing 310 and along the first heat convection path is enhanced. The enhanced flow of gas/air through the housing 310 improves the cooling. The first wall 326 of the first embodiment may be called "radiation sheet".

The first wall 326 may have a first surface 330 facing the unit 304. The emissivity of the first surface 330 may be between 0.7 and 1, e.g. between 0.9 and 1. The first wall 326 may have a second surface 332 facing the sound-absorbing member 324. The emissivity of the second surface 332 may be between 0.7 and 1, e.g. between 0.9 and 1. The above-mentioned emissivity may be attained by suitable coating, painting or anodizing etc. of the wall surface or by selected a wall material with the above-mentioned emissivity. The second surface 332 should be free of any sound-absorbing material. The second surface 332 should be free of any thermal or heat insulating material in order to allow the heat of the first wall 326 to efficiently heat the gas/air in the free space 328. The first surface 330 should be free of any thermal or heat insulating material in order to allow the gas/air in the main chamber 312 to efficiently heat the first wall 326.

Figure 4:
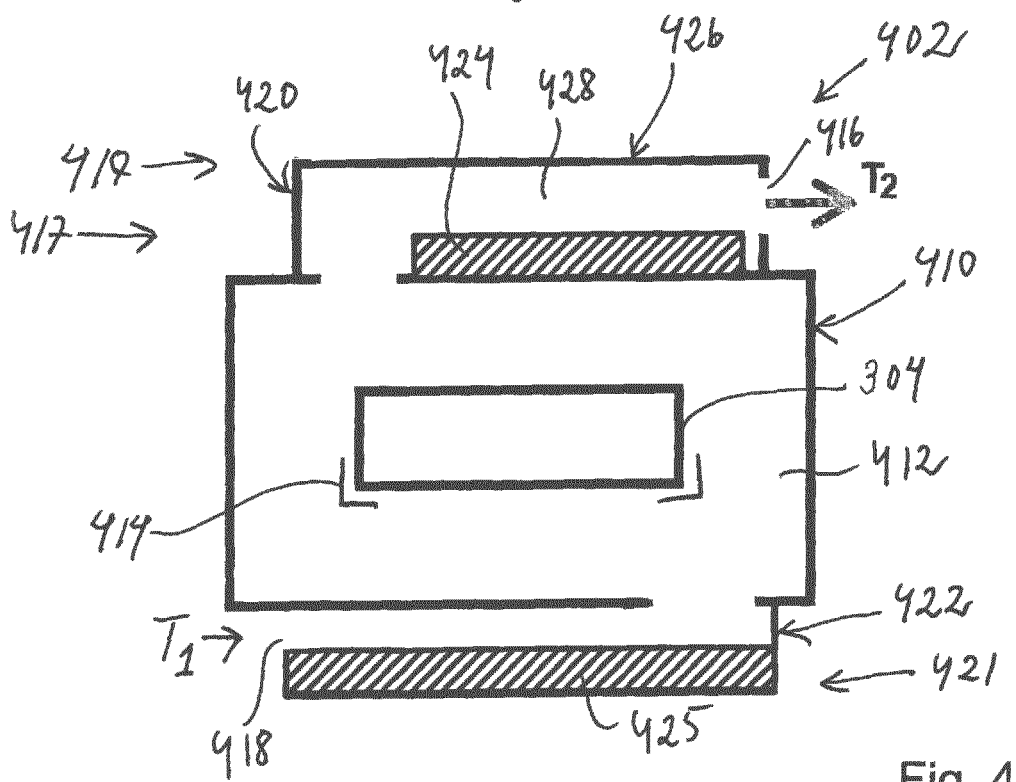
FIG. 4 is a schematic sectional side view of a second embodiment of the apparatus according to the present invention.

With reference to the second embodiment of the apparatus 402 of FIG. 4, the at least one heat conducting wall 426 may comprise a heat conducting third wall 426 situated at an upper part 417 or upper end 419 of the housing 410. The third wall is an exterior wall of the housing 410 and of the gas exit chamber 420. The at least one free space 428 is provided in the gas exit chamber 420 between the at least one sound-absorbing member 424 and the third wall 426 such that the first heat convection path is provided inside the housing 410 between the at least one gas entry opening 418 and the at least one gas exit opening 416 via the at least one free space 428. The third wall 426 may have a substantially horizontal extension, or an extension in any other direction or directions. By providing said at least one free space 428 between the at least one sound-absorbing member 424 and the third wall 426 and including the at least one free space 428 in the first heat convection path, heat from outside, such as outside radiation heat, e.g. heat of the sun's radiation, and received by the third wall 426 heats the gas or gas mixture flowing in and passing through the at least one free space 428, whereby the temperature $T_2$ of the gas or gas mixture, e.g. air, exiting the at least one gas exit opening 416 will be additionally increased. The additional increase in the temperature of the exit gas mixture exiting the at least one gas exit opening 416 increases the above-mentioned gas/air temperature difference $\Delta T=T_2-T_1$, whereby the gas or gas mixture flow through the housing 410 and along the first heat convection path is enhanced. The enhanced flow of gas/air through the housing 410 improves the cooling. If the sound-absorbing member instead were adjoining the third wall 426, as in prior art (see FIGS. 1 and 2), the thermal insulating sound-absorbing member would hinder the heat transfer through the third wall from the ambient to the air/gas of the gas exit chamber, preventing the outside heat from additionally increasing the temperature of the air/gas of the gas exit chamber.

Further, the sound-absorbing member 424 of the second embodiment, when being thermal insulating, prevents heat radiation from the air/gas in the free space 428 to be transferred or transmitted to the air/gas of the main chamber 412. Thus, the unit 304 will be efficiently shielded from any sun heating.

Figure 5:
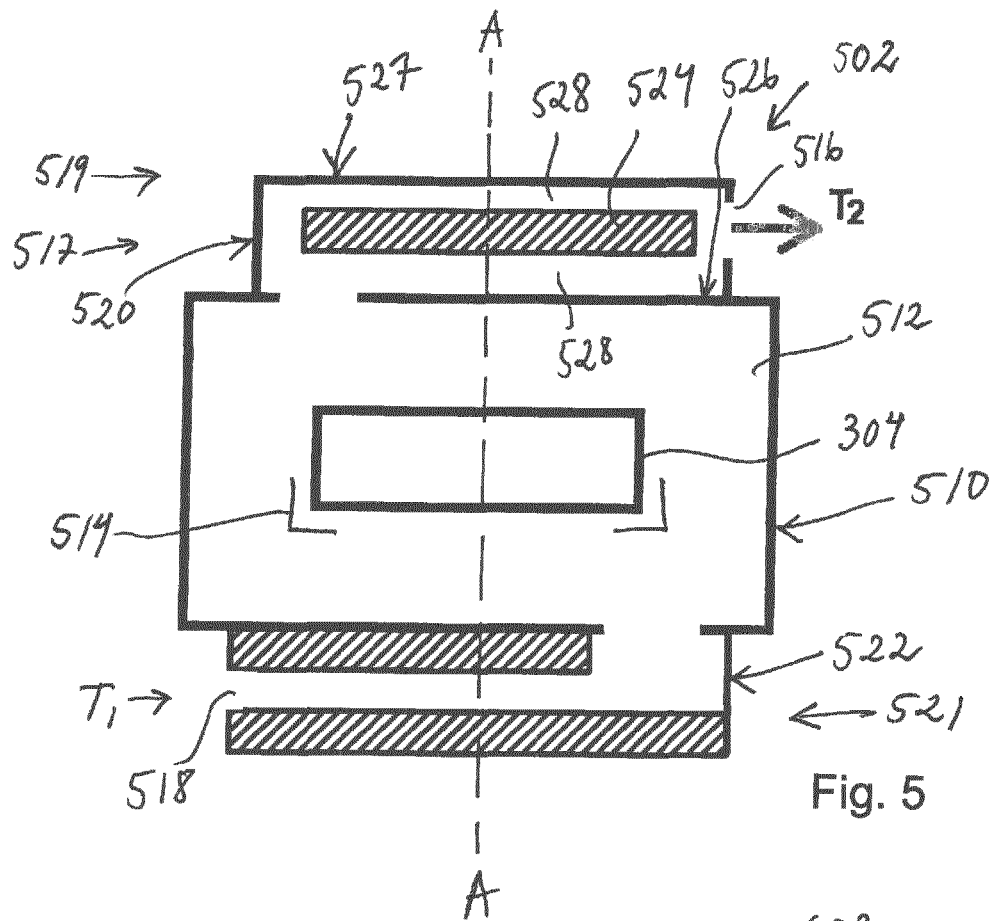
FIG. 5 is a schematic sectional side view of a third embodiment of the apparatus according to the present invention.
Figure 7:
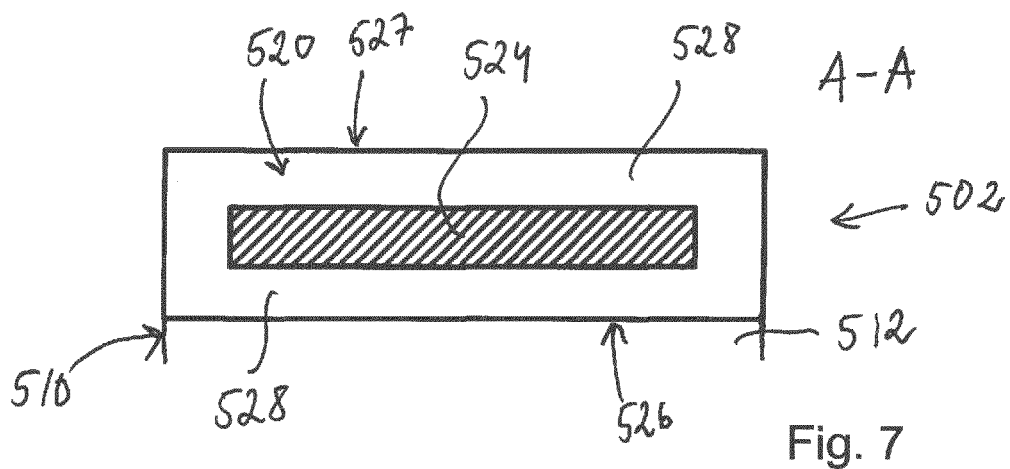
FIG. 7 shows the section A-A of FIG. 5 illustrating the sound-absorptive gas exit chamber of the third embodiment in cross-section.

The third embodiment of the apparatus 502 of FIGS. 5 and 7 is essentially a combination of the two embodiments shown in FIGS. 3 and 4. With reference to the third embodiment of FIGS. 5 and 7, the at least one heat conducting wall 526, 527 may comprise a heat conducting first wall 526 situated between the gas exit chamber 520 and the main chamber 512. The first wall 526 is a wall of the main chamber 512 and of the gas exit chamber 520. The at least one free space 528 is provided in the gas exit chamber 520 between the at least one sound-absorbing member 524 and the first wall 526 such that the first heat convection path is provided inside the housing 510 between the at least one gas entry opening 518 and the at least one gas exit opening 516 via the at least one free space 528. The first wall 526 of the third embodiment shown in FIGS. 5 and 7 may essentially correspond to the first wall 326 of the first embodiment shown in FIG. 3. With further reference to the third embodiment of FIGS. 5 and 7, the at least one heat conducting wall 526, 527 may comprise a heat conducting third wall 527 situated at an upper part 517, e.g. an upper end 519, of the housing 510. The third wall is an exterior wall of the housing 510 and of the gas exit chamber 520. The at least one free space 528 is provided in the gas exit chamber 520 between the at least one sound-absorbing member 524 and the third wall 527 such that the first heat convection path is provided inside the housing 510 between the at least one gas entry opening 518 and the at least one gas exit opening 516 via the at least one free space 528. The third wall 527 of the third embodiment shown in FIGS. 5 and 7 may essentially correspond to the third wall 426 of the second embodiment shown in FIG. 4. By means of the third embodiment of FIGS. 5 and 7, the technical effects of the first and second embodiments are combined, providing a further enhanced flow or gas/air through the housing 510 and thus a further improved cooling. With reference to FIG. 7, the at least one free space 528 of the third embodiment may comprise one tubular free space 528, e.g. a free space shaped as tube having a circular or rectangular cross-section.

With reference to the embodiments of the apparatus of FIGS. 3-5, the gas entry chamber of each embodiment may have any suitable configuration, e.g. a configuration different from the configuration of the respective gas entry chamber shown in FIGS. 3-5. The respective gas entry chamber may e.g. be structured as shown in any of the FIGS. 1-6.

Figure 6:
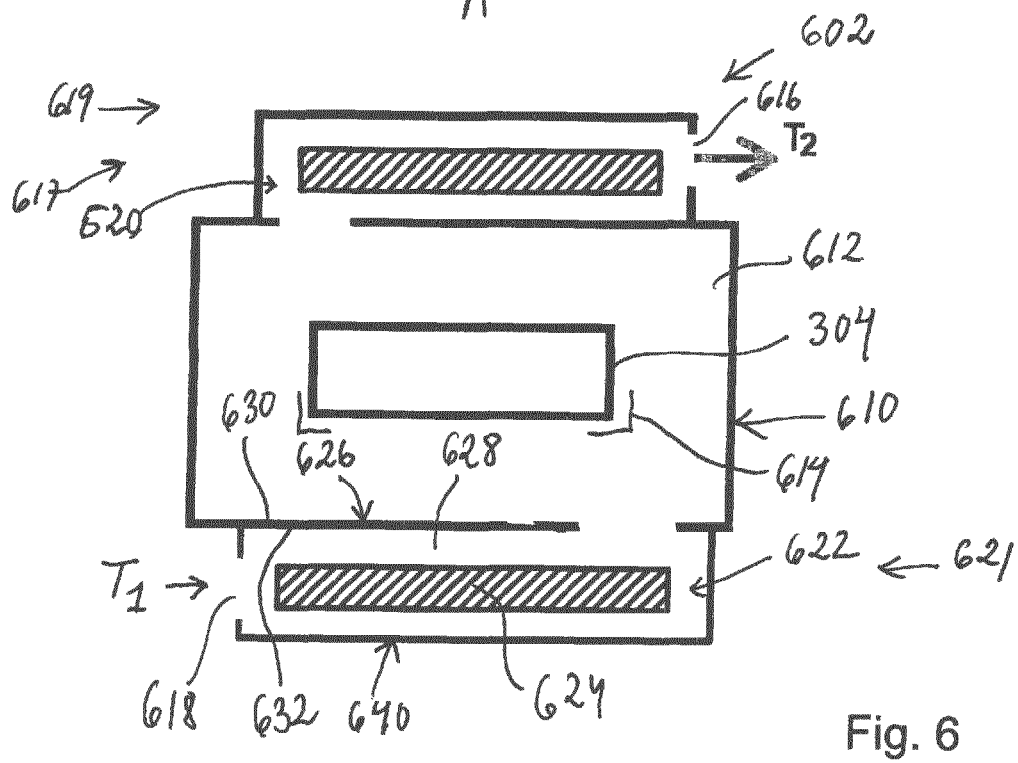
FIG. 6 is a schematic sectional side view of a fourth embodiment of the apparatus according to the present invention.

With reference to the fourth embodiment of the apparatus 602 of FIG. 6, the at least one heat conducting wall 626 may comprise a heat conducting second wall 626 situated between the gas entry chamber 622 and the main chamber 612. The second wall 626 may be a wall of the main chamber 612 and of the gas entry chamber 622. The at least one free space 628 is provided in the gas entry chamber 622 between the at least one sound-absorbing member 624 and the second wall 626 such that the first heat convection path is provided inside the housing 610 between the at least one gas entry opening 618 and the at least one gas exit opening 616 via the at least one free space 628. The second wall may at least partially separate the gas entry chamber 622 from the main chamber 612. The second wall 626 may be a lower wall at a lower part 621 of the housing 610. The second wall 626 may have a substantially horizontal extension, or an extension in any other suitable direction/-s. By providing said at least one free space 628 between the at least one sound-absorbing member 624 and the second wall 626 and including the at least one free space 628 in the first heat convection path, heat from the unit 604 and received by the second wall 626 heats the gas or gas mixture flowing through the at least one free space 628, whereby the temperature of the gas or gas mixture, e.g. air, close to the second wall 626 in the gas entry chamber 622 will be additionally increased, and the temperature of the air/gas close to the second wall 626 in the main chamber 612 will be cooled, whereby the gas or gas mixture flow through the housing 610 and along the first heat convection path is enhanced. The enhanced flow of gas/air through the housing 610 improves the cooling. If the sound-absorbing member instead were adjoining the second wall, as in prior art (see FIG. 2), the thermal insulating sound-absorbing member would hinder the heat transfer through the second wall from the air/gas of the main chamber to the air/gas of the gas entry chamber. In FIG. 6, the sound-absorbing member 624 is centrally located in the gas entry chamber 622, corresponding to the position of the sound-absorbing member 524 in the gas exit chamber 520 of the embodiment of FIGS. 5 and 7. However, the sound-absorbing member 624 could also be adjoining the gas entry chamber wall 640 opposite the second wall 626. The gas exit chamber 620 of the fourth embodiment of the apparatus 602 may e.g. correspond to the gas exit chamber 320, 420, 520 of any of the embodiments shown in FIGS. 3-5, or may have another design.

The second wall 626 may have a first surface 630 facing the unit 304. The emissivity of the first surface 630 may be between 0.7 and 1, e.g. between 0.9 and 1. The second wall 626 may have a second surface 632 facing the sound-absorbing member 624. The emissivity of the second surface 632 may be between 0.7 and 1, e.g. between 0.9 and 1. The second surface 632 should be free of any sound-absorbing material. The second surface 632 should be free of any thermal or heat insulating material in order to allow the heat of the second wall 626 to efficiently heat the gas/air in the free space 628. The first surface 630 should be free of any thermal or heat insulating material in order to allow the gas/air in the main chamber 612 to efficiently heat the second wall 626.

Figure 8:
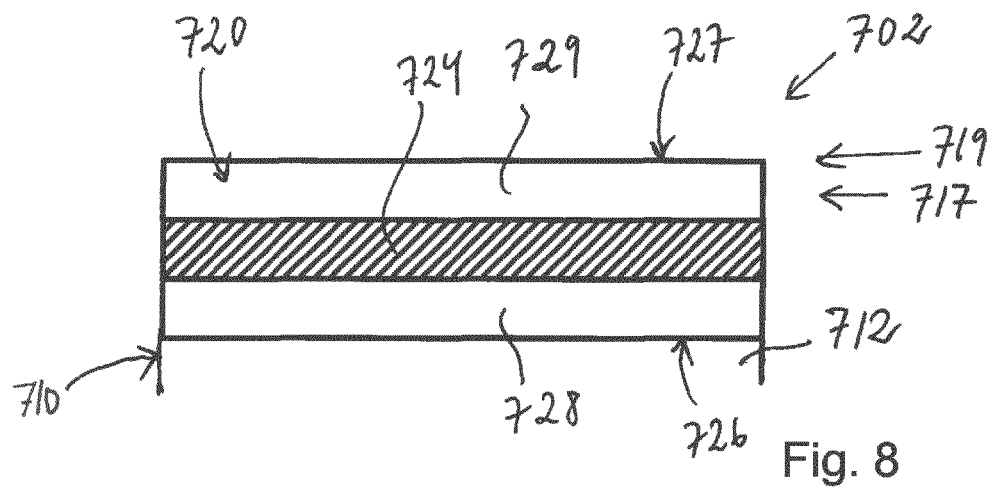
FIG. 8 is a schematic cross-section view of the sound-absorptive gas exit chamber of a fifth embodiment of the apparatus according to the present invention.

With reference to the fifth embodiment of the apparatus 702 of FIG. 8, where only the sound-absorptive gas exit chamber 720 of a sixth embodiment of the apparatus 702 according to the present invention is illustrated. The fifth embodiment of the apparatus 702 of FIG. 8 may essentially correspond to the third embodiment of FIGS. 5 and 7. However, instead of one free space, two free spaces 728, 729 are provided in the gas exit chamber 720 as follows. The at least one heat conducting wall 726, 727 may comprise a heat conducting first wall 726 situated between the gas exit chamber 720 and the main chamber 712. The first wall 726 is a wall of the main chamber 712 and of the gas exit chamber 720. At least one first free space 728 is provided in the gas exit chamber 720 between the at least one sound-absorbing member 724 and the first wall 726 such that the first heat convection path is provided inside the housing 710 between the at least one gas entry opening and the at least one gas exit opening via the first free space 728. The first wall 726 of the fifth embodiment shown in FIG. 8 may essentially correspond to the first wall 326 of the first embodiment shown in FIG. 3. With further reference to the fifth embodiment of FIG. 8, the at least one heat conducting wall 726, 727 may comprise a heat conducting third wall 727 situated at an upper part 717, e.g. an upper end 719, of the housing 710. The third wall 727 is an exterior wall of the housing 710 and of the gas exit chamber 720. At least one second free space 729 is provided between the at least one sound-absorbing member 724 and the third wall 727. A second heat convection path is provided inside the housing 710 between the at least one gas entry opening and the at least one gas exit opening, via the gas entry chamber, via the main chamber 710, via the gas exit chamber 720 and via the at least one second free space 729, in order to provide cooling. Otherwise, the fifth embodiment of the apparatus 702 of FIG. 8 may correspond to the third embodiment of FIG. 5.

With reference to FIG. 9 a sixth embodiment of the apparatus 902 is schematically illustrated. The sixth embodiment may essentially correspond to the third embodiment of FIG. 5, but the passage 911 of the first free heat convection path from the main chamber 912 to the gas exit chamber 920 through the first wall 926 is centrally located in the first wall 926. Further, the third wall 927 may be arched or angled, and the at least one gas exit opening 916 is located in an upper region of the arch. By means of the sixth embodiment, the gas or gas mixture flow through the housing 910 and along the first free heat convection path is further enhanced. The enhanced flow of gas/air through the housing 910 improves the cooling. The arched or angled shape of the third wall 927 also prevents rain water and dust from remaining on the outer surface of the third wall 927.

With reference to FIGS. 10a-c, some alternative shapes of the third wall 950; 952; 954 are shown. The third wall 950, 952 may e.g. have a pyramid or dome shape, and the at least one gas exit opening is located in an upper region of the pyramid or dome formed by the third wall 950, 952.

Each of the housings 310; 410; 510; 610; 710; 910 disclosed above is arranged to enclose the unit 304 in a sound-absorbing manner.

Each embodiment of the apparatus 302; 402; 502; 602; 702; 902 according to the present invention and disclosed above provides efficient cooling even when the ambient air temperature, i.e. the temperature outside of the housing 310; 410; 510; 610; 710; 910, already is high at the gas entry opening 318; 418; 518; 618; 918, and/or when the sun's radiation heats the exterior of the housing 310; 410; 510; 610; 710; 910.

Each of the first wall and second wall disclosed above may have a thermal conductivity above 10 W/m·K. Each third wall disclosed above may also have a thermal conductivity above 10 W/(m·K).

According to various embodiments of the electric power arrangement according to the present invention, the electric power arrangement comprises at least one medium voltage and/or high voltage unit 304 connectable to an electric power system. Each unit 304 comprises one or a plurality of electrical components and may comprise at least one apparatus 302; 402; 502; 602; 702; 902 according to any of the embodiments disclosed above. Each electrical component may comprise a capacitor.

The features of the different embodiments of the apparatus and the electric power arrangement, respectively, disclosed above may be combined in various possible ways providing further advantageous embodiments.

The invention shall not be considered limited to the embodiments illustrated, but can be modified and altered in many ways by one skilled in the art, without departing from the scope of the appended claims.

The invention claimed is:

1. An apparatus for enclosing at least one medium and/or high voltage unit connectable to an electric power system, each unit comprising one or a plurality of electrical components and generating heat as a by-product during operation, wherein the apparatus comprises:

a housing which comprises:
  a main chamber housing a seat for holding the unit, the main chamber being arranged to house the unit;
  at least one gas exit opening at an upper part of the housing and at least one gas entry opening;
  a sound-absorptive gas exit chamber provided with the at least one gas exit opening; and
  a sound-absorptive gas entry chamber provided with the at least one gas entry opening,
  wherein a first heat convection path is provided inside the housing between the at least one gas entry opening and the at least one gas exit opening, via the gas entry chamber, via the main chamber and via the gas exit chamber, in order to provide cooling,
  wherein each of the gas exit chamber and the gas entry chamber houses at least one sound-absorbing member made at least partially of a sound-absorbing material for absorbing sound produced by the unit during operation,
  wherein at least one of the gas exit chamber and the gas entry chamber has at least one heat conducting wall and at least one free space provided between the at least one sound-absorbing member and said heat conducting wall such that the first heat convection path is provided inside the housing between the at least one gas entry opening and the at least one gas exit opening via the at least one free space, and
  wherein the heat conducting wall heats the gas or gas mixture flowing in and passing through the at least one free space.

2. The apparatus according to claim 1, wherein the at least one gas exit opening is located at a height above the unit when the unit is placed in the seat.

3. The apparatus according to claim 1, wherein the at least one heat conducting wall comprises a heat conducting first wall situated between the gas exit chamber and the main chamber, the first wall being a wall of the main chamber and of the gas exit chamber, and wherein the at least one free space is provided in the gas exit chamber between the at least one sound-absorbing member and the first wall such that the first heat convection path is provided inside the housing between the at least one gas entry opening and the at least one gas exit opening via the at least one free space.

4. The apparatus according to claim 3, wherein the first wall is an upper wall at an upper part of the housing.

5. The apparatus according to claim 1, wherein the at least one heat conducting wall comprises a heat conducting second wall situated between the gas entry chamber and the main chamber, the second wall being a wall of the main chamber and of the gas entry chamber, and wherein the at least one free space is provided in the gas entry chamber between the at least one sound-absorbing member and the second wall such that the first heat convection path is provided inside the housing between the at least one gas entry opening and the at least one gas exit opening via the at least one free space.

6. The apparatus according to claim 3, wherein the first wall and/or the second wall have/has a first surface facing the unit, and wherein the emissivity of the first surface is between 0.7 and 1.

7. The apparatus according to claim 3, wherein the first wall and/or the second wall have/has a second surface facing the sound-absorbing member, and wherein the emissivity of the second surface is between 0.7 and 1.

8. The apparatus according to claim 3, wherein the first wall and/or the second wall have/has a substantially horizontal extension.

9. The apparatus according to claim 1, wherein the at least one heat conducting wall comprises a heat conducting third wall situated at an upper part of the housing, the third wall being an exterior wall of the housing and of the gas exit chamber, and wherein the at least one free space is provided in the gas exit chamber between the at least one sound-absorbing member and the third wall such that the first heat convection path is provided inside the housing between the at least one gas entry opening and the at least one gas exit opening via the at least one free space.

10. The apparatus according to claim 1, wherein the at least one heat conducting wall comprises a heat conducting third wall situated at an upper part of the housing, the third wall being an exterior wall of the housing and of the gas exit chamber, wherein at least one second free space is provided between the at least one sound-absorbing member and the third wall, and wherein a second heat convection path is provided inside the housing between the at least one gas entry opening and the at least one gas exit opening, via the gas entry chamber, via the main chamber, via the gas exit chamber and via the at least one second free space, in order to provide cooling.

11. The apparatus according to claim 9, wherein the third wall has a substantially horizontal extension.

12. The apparatus according to claim 9, wherein the third wall is arched or has a pyramid or dome shape, and wherein the at least one gas exit opening is located in an upper region of the arch, pyramid or dome formed by the third wall.

13. The apparatus according to claim 1, wherein the at least one gas entry opening is located at a lower part of the housing, e.g. at a height below the at least one gas exit opening.

14. An electric power arrangement comprising:
  at least one medium and/or high voltage unit connectable to an electric power system, each unit comprising one or a plurality of electrical components and generating heat as a by-product during operation; and
  at least one apparatus as claimed in claim 1.

15. The electric power arrangement according to claim 14, wherein each electrical component comprises a capacitor.

16. The apparatus according to claim 3, wherein the first wall and/or the second wall have/has a first surface facing the unit, and wherein the emissivity of the first surface is between 0.9 and 1.

17. An apparatus according to claim 3, wherein the first wall and/or the second wall have/has a second surface facing the sound-absorbing member, and in that the emissivity of the second surface is between 0.9 and 1.

18. The apparatus according to claim 1, wherein the at least one gas entry opening is located at a lower part of the housing at a height below the at least one gas exit opening.

19. An apparatus according to claim 2, wherein the at least one heat conducting wall comprises a heat conducting first wall situated between the gas exit chamber and the main chamber, the first wall being a wall of the main chamber and of the gas exit chamber, and wherein the at least one free space is provided in the gas exit chamber between the at least one sound-absorbing member and the first wall such that the first heat convection path is provided inside the housing between the at least one gas entry opening and the at least one gas exit opening via the at least one free space.

20. An apparatus according to claim 2, wherein the at least one heat conducting wall comprises a heat conducting second wall situated between the gas entry chamber and the main chamber, the second wall being a wall of the main chamber and of the gas entry chamber, and wherein the at least one free space is provided in the gas entry chamber between the at least one sound-absorbing member and the second wall such that the first heat convection path is provided inside the housing between the at least one gas entry opening and the at least one gas exit opening via the at least one free space.

* * * * *